United States Patent
Xia et al.

(10) Patent No.: US 10,120,252 B2
(45) Date of Patent: Nov. 6, 2018

(54) ARRAY SUBSTRATE AND MANUFACTURING METHOD THEREOF

(71) Applicant: SHENZHEN CHINA STAR OPTOELECTRONICS TECHNOLOGY CO., LTD., Shenzhen (CN)

(72) Inventors: Hui Xia, Shenzhen (CN); Tienchun Huang, Shenzhen (CN)

(73) Assignee: SHENZHEN CHINA STAR OPTOELECTRONICS TECHNOLOGY CO., LTD., Shenzhen (CN)

( * ) Notice: Subject to any disclaimer, the term of this patent is extended or adjusted under 35 U.S.C. 154(b) by 168 days.

(21) Appl. No.: 15/123,064

(22) PCT Filed: Apr. 28, 2016

(86) PCT No.: PCT/CN2016/080435
§ 371 (c)(1),
(2) Date: Sep. 1, 2016

(87) PCT Pub. No.: WO2017/173685
PCT Pub. Date: Oct. 12, 2017

(65) Prior Publication Data
US 2018/0088422 A1   Mar. 29, 2018

(30) Foreign Application Priority Data

Apr. 8, 2016   (CN) .......................... 2016 1 0216334

(51) Int. Cl.
*H01L 31/072*   (2012.01)
*G02F 1/1362*   (2006.01)
(Continued)

(52) U.S. Cl.
CPC ...... *G02F 1/136227* (2013.01); *G02F 1/1335* (2013.01); *G02F 1/1343* (2013.01); *G02F 1/1368* (2013.01); *G02F 1/136277* (2013.01); *H01L 21/77* (2013.01); *H01L 27/12* (2013.01); *H01L 27/124* (2013.01); *G02F 2001/133357* (2013.01)

(58) Field of Classification Search
CPC ............. H01L 51/0072; H01L 51/0097; H01L 51/5056; H01L 23/66; C09K 11/06
USPC ....................................... 257/192
See application file for complete search history.

(56) References Cited

U.S. PATENT DOCUMENTS

| | | | | |
|---|---|---|---|---|
| 6,191,452 B1* | 2/2001 | Oda | .................. | H01L 29/66765 257/284 |
| 2015/0277199 A1* | 10/2015 | Chang | ............... | G02F 1/136286 349/12 |
| 2017/0023615 A1* | 1/2017 | Ekin | ..................... | G01R 1/0491 |

* cited by examiner

*Primary Examiner* — Andy Huynh
(74) *Attorney, Agent, or Firm* — Osha Liang LLP

(57) ABSTRACT

An array substrate and a manufacturing method thereof are disclosed. The array substrate includes: a glass substrate; a gate electrode; a first insulating layer; a semiconductor layer; a planarization layer mounted on the first insulating layer; a source electrode and a drain electrode; a pixel electrode layer mounted on the planarization layer and the drain electrode; a second insulating layer mounted on the planarization layer, the semiconductor layer, the source electrode and the drain electrode. The array substrate can prevent bubbles from forming at through holes and thereby increasing aperture ratio. The planarization layer further increases distances between the source electrode, the drain electrode and the gate electrode, which enhances antistatic ability.

9 Claims, 2 Drawing Sheets

(51) Int. Cl.
*G02F 1/1368* (2006.01)
*H01L 21/77* (2017.01)
*H01L 27/12* (2006.01)
*G02F 1/1335* (2006.01)
*G02F 1/1343* (2006.01)
*G02F 1/1333* (2006.01)

ARRAY SUBSTRATE AND MANUFACTURING METHOD THEREOF

BACKGROUND OF THE INVENTION

Field of the Invention

The present invention relates to the technical field of liquid crystal display, and more particularly to an array substrate and a manufacturing method thereof.

Description of the Related Art

In the current LCD device manufacturing process, it is common to form contact holes for connecting a pixel electrode layer and a drain metal layer. However, using contact holes may easily cause the following problem: it requires a certain size of contact holes to ensure contact reliability, which leads to reduction of aperture ratio and uneven surfaces where bubbles are easily formed.

Therefore, the conventional technology has its shortcoming and is in urgent need of improvement.

SUMMARY OF THE INVENTION

An objective of the present invention is to provide an array substrate and a manufacturing method thereof so as to solve the technical problem of low aperture ratio of array substrates in the art.

In order to solve the foregoing problem, the technical solutions of the present invention are as follows:

an array substrate, including:

a glass substrate;

a gate electrode mounted on the glass substrate;

a first insulating layer deposited on the glass substrate and the gate electrode;

a semiconductor layer mounted on the first insulating layer and positioned on a top of the gate electrode;

a planarization layer mounted on the first insulating layer;

a source electrode mounted on the planarization layer and the semiconductor layer;

a drain electrode mounted on the planarization layer and the semiconductor layer;

a pixel electrode layer mounted on the planarization layer and the drain electrode;

a second insulating layer mounted on the planarization layer, the semiconductor layer, the source electrode and the drain electrode.

In the array substrate of the present invention, the semiconductor layer includes:

an amorphous silicon layer deposited on the first insulating layer;

a doped semiconductor layer mounted on the amorphous silicon layer.

In the array substrate of the present invention, the first insulating layer is made of silicon nitride and/or silicon dioxide.

In the array substrate of the present invention, the second insulating layer is made of silicon nitride and/or silicon dioxide.

In the array substrate of the present invention, the planarization layer is formed by 3D printing using nano-powder material or liquid insulating material.

In the array substrate of the present invention, the drain electrode has a side surface which is away from one side of the source electrode and is inclined towards the source electrode, and the pixel electrode layer covers the side surface.

The present invention further provides another array substrate including:

a glass substrate;

a gate electrode mounted on the glass substrate;

a first insulating layer deposited on the glass substrate and the gate electrode;

a semiconductor layer mounted on the first insulating layer and positioned on a top of the gate electrode;

a planarization layer mounted on the first insulating layer;

a source electrode mounted on the planarization layer and the semiconductor layer;

a drain electrode mounted on the planarization layer and the semiconductor layer;

a pixel electrode layer mounted on the planarization layer and the drain electrode;

a second insulating layer mounted on the planarization layer, the semiconductor layer, the source electrode and the drain electrode; wherein the semiconductor layer includes:

an amorphous silicon layer deposited on the first insulating layer;

a doped semiconductor layer mounted on the amorphous silicon layer;

the drain electrode has a side surface which is away from one side of the source electrode and is inclined towards the source electrode, and the pixel electrode layer covers the side surface.

The present invention further provides a manufacturing method of an array substrate which includes steps of:

mounting a gate electrode on a glass substrate;

depositing a first insulating layer on the glass substrate and the gate electrode;

depositing a semiconductor layer on the first insulating layer, wherein the semiconductor layer is disposed on a top of the gate electrode;

mounting a planarization layer on the first insulating layer;

mounting a source electrode on the planarization layer and the semiconductor layer;

mounting a drain electrode on the planarization layer and the semiconductor layer;

mounting a pixel electrode layer on the planarization layer and the drain electrode;

depositing a second insulating layer on the planarization layer, the semiconductor layer, the source electrode and the drain electrode.

In the manufacturing method of the array substrate of the present invention, the planarization layer is formed by 3D printing using nano-powder material or liquid insulating material.

In the manufacturing method of the array substrate of the present invention, the drain electrode has a side surface which is away from one side of the source electrode and is inclined towards the source electrode, and the pixel electrode layer covers the side surface.

In the manufacturing method of the array substrate of the present invention, the first insulating layer and the second insulating layer are both made of silicon nitride and/or silicon dioxide.

Compared with conventional technology, by mounting the planarization layer on the first insulating layer and then forming the source electrode and the drain electrode on the planarization layer and the semiconductor layer without the need of forming source and drain through holes, the array substrate provided by the present invention can achieve the connection between the source electrode, the drain electrode and the semiconductor layer, and directly form the pixel electrode layer on the planarization layer and the drain electrode. Thus, the array substrate can achieve electrical connection between the drain electrode and the pixel electrode layer, and therefore has functional effects of preventing bubbles from forming near through holes, and increasing aperture ratio. The planarization layer further increases distances between the source electrode, the drain electrode and the gate electrode, which enhances antistatic ability.

DETAILED DESCRIPTION OF THE PREFERRED EMBODIMENTS

Figure 1:
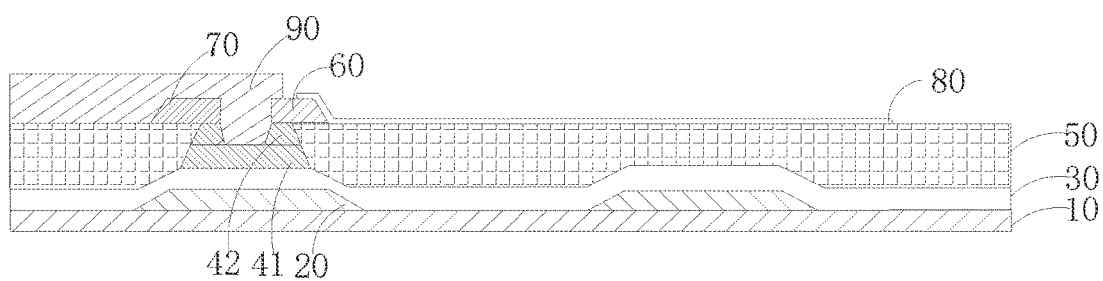
FIG. 1 is a schematic structural view of an array substrate according to a preferred embodiment of the present invention.

The foregoing objects, features and advantages adopted by the present invention can be best understood by referring to the following detailed description of the preferred embodiments and the accompanying drawings. Furthermore, the directional terms described in the present invention, such as upper, lower, front, rear, left, right, inner, outer, side and etc., are only directions referring to the accompanying drawings, so that the used directional terms are used to describe and understand the present invention, but the present invention is not limited thereto.

In the drawings, similar structural units are designated by the same reference numerals.

With reference to FIG. 1, FIG. 1 is a schematic structural view of an array substrate according to a preferred embodiment of the present invention. The array substrate of the preferred embodiment comprises: a glass substrate 10, a gate electrode 20, a first insulating layer 30, a semiconductor layer 40, a planarization layer 50, a source electrode 70, a drain electrode 60, a pixel electrode layer 80, and a second insulating layer 90.

The gate electrode 20 is mounted on the glass substrate 10. When forming the gate electrode 20, a gate electrode layer is deposited on the glass substrate 10 by physical vapor deposition, and then a patterning treatment is performed on the gate electrode layer so as to form the gate electrode 20.

The first insulating layer 30 is deposited on the glass substrate 10 and the gate electrode 20. The first insulating layer 30 is used to insulate the gate electrode 20 from the semiconductor layer 40 and can be made of inorganic insulating material, such as silicon nitride, silicon dioxide. The first insulating layer 30 is deposited on the glass substrate 10 and the gate electrode 20 by chemical vapor deposition.

The semiconductor layer 40 is mounted on the first insulating layer 30 and positioned on a top of the gate electrode 20, and may include an amorphous silicon layer deposited on the first insulating layer 30 and a doped semiconductor layer 42 mounted on the amorphous silicon layer. When forming the semiconductor layer 40, first deposit a layer of amorphous silicon on the first insulating layer 30 by vapor deposition, and then perform a patterning treatment on the amorphous silicon to form an amorphous silicon layer 41 at a bottom and a first contact portion and a second contact portion on the amorphous silicon layer 41, and then dope the first contact portion and the second contact portion so as to form the doped semiconductor layer 42. The doped semiconductor layer 42 is used for the source electrode 70 and the drain electrode 60 to be electrically connected to the amorphous silicon layer 41, respectively.

The planarization layer 50 is mounted on the first insulating layer 30, and may be made of inorganic insulating material, such as silicon nitride, silicon dioxide, or organic insulating material. The planarization layer 50 may be deposited on the first insulating layer 30 by chemical vapor deposition. The planarization layer 50 may be formed by 3D printing using nano-powder material or liquid insulating material.

The planarization layer 50 is coplanar with a surface of the first contact portion and a surface of the second contact portion which are away from the amorphous silicon layer 41 so as to facilitate forming the source electrode 70 and the drain electrode 60.

The source electrode 70 and the drain electrode 60 are both mounted on the planarization layer 50 and the semiconductor layer 40. Specifically, the source electrode 70 is mounted on the first contact portion and the planarization layer 50, and the drain electrode 60 is mounted on the second contact portion and the planarization layer 50.

The pixel electrode layer 80 is mounted on the planarization layer 50 and the drain electrode 60 with a plurality of pixel electrodes formed thereon. Preferably, the drain electrode 60 has a side surface which is away from one side of the source electrode 70 and is inclined towards the source electrode 70, and the pixel electrode layer 80 covers the side surface of the drain electrode 60 and also covers a top surface of the drain electrode 60.

The second insulating layer 90 is mounted on the planarization layer 50, the semiconductor layer 40, the source electrode 70, and the drain electrode 60. The second insulating layer 90 may be made of silicon nitride and/or silicon dioxide by chemical vapor deposition.

By mounting the planarization layer 50 on the first insulating layer 30 and then forming the source electrode 70 and the drain electrode 60 on the planarization layer 50 and the semiconductor layer 40, the array substrate provided by the preferred embodiment can achieve the connection between the source electrode 70, the drain electrode 60 and the semiconductor layer 40 without the need of forming source and drain through holes, and can directly form the pixel electrode layer 80 on the planarization layer 50 and the drain electrode 60. Thus, the array substrate can achieve electrical connection between the drain electrode 60 and the pixel electrode layer 80 without the need of forming through holes, and therefore has functional effects of preventing bubbles from forming near through holes, and increasing aperture ratio. The planarization layer 50 further increases distances between the source electrode, the drain electrode and the gate electrode 20, which enhances antistatic ability.

Figure 2:
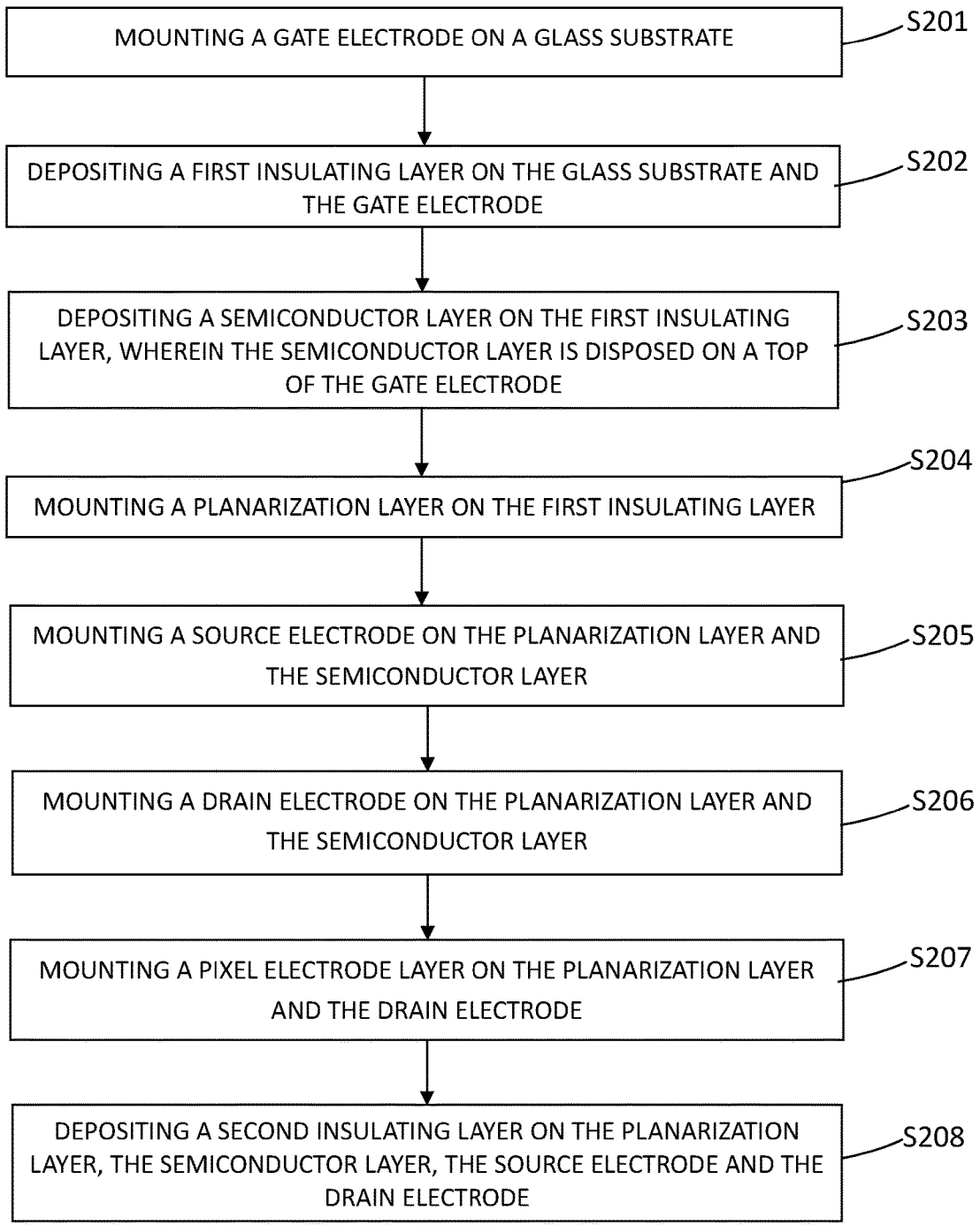
FIG. 2 is a flow chart of a manufacturing method of an array substrate according to a preferred embodiment of the present invention.

With reference to FIG. 2, FIG. 2 is a flow chart of a manufacturing method of an array substrate according to a preferred embodiment of the present invention. The manufacturing method includes the following steps:

S201: mounting a gate electrode on a glass substrate;

S202: depositing a first insulating layer on the glass substrate and the gate electrode;

S203: depositing a semiconductor layer on the first insulating layer, wherein the semiconductor layer is disposed on a top of the gate electrode;

S204: mounting a planarization layer on the first insulating layer;

S205: mounting a source electrode on the planarization layer and the semiconductor layer;

S206: mounting a drain electrode on the planarization layer and the semiconductor layer;

S207: mounting a pixel electrode layer on the planarization layer and the drain electrode;

S208: depositing a second insulating layer on the planarization layer, the semiconductor layer, the source electrode and the drain electrode.

Hereinafter, detailed descriptions of each step of the manufacturing method of the array substrate are provided.

In the step S201, when forming the gate electrode 20, a gate electrode layer is deposited on the glass substrate 10 by physical vapor deposition, and then a patterning treatment is performed on the gate electrode layer so as to form the gate electrode 20.

In the step S202, the first insulating layer 30 is deposited on the glass substrate 10 and the gate electrode 20 by chemical vapor deposition, and may be made of inorganic insulating material, such as silicon nitride, silicon dioxide.

In the step S203, the semiconductor layer 40 includes an amorphous silicon layer deposited on the first insulating layer 30 and a doped semiconductor layer 42 mounted on the amorphous silicon layer. When forming the semiconductor layer 40, first deposit a layer of amorphous silicon on the first insulating layer 30 by vapor deposition, and then perform a patterning treatment on the amorphous silicon to form an amorphous silicon layer 41 at a bottom and a first contact portion and a second contact portion on the amorphous silicon layer 41, and then dope the first contact portion and the second contact portion so as to form the doped semiconductor layer 42. The doped semiconductor layer 42 is used for the source electrode 70 and the drain electrode 60 to be electrically connected to the amorphous silicon layer 41, respectively.

In the step S204, the planarization layer 50 may be made of inorganic insulating material, such as silicon nitride, silicon dioxide, or organic insulating material. The planarization layer 50 may be deposited on the first insulating layer 30 by chemical vapor deposition. The planarization layer 50 can also be formed by 3D printing using nano-powder material or liquid insulating material. The planarization layer 50 is coplanar with a surface of the first contact portion and a surface of the second contact portion which are away from the amorphous silicon layer 41 so as to facilitate forming the source electrode 70 and the drain electrode 60.

In the steps S205 and S206, the source electrode 70 is mounted on the first contact portion and the planarization layer 50, and the drain electrode 60 is mounted on the second contact portion and the planarization layer 50.

In the step S207, the pixel electrode layer 80 has a plurality of pixel electrodes formed thereon. Preferably, the drain electrode 60 has a side surface which is away from one side of the source electrode 70 and is inclined towards the source electrode 70, and the pixel electrode layer 80 covers the side surface of the drain electrode 60 and also covers a top surface of the drain electrode 60. The structure design of the drain electrode 60 can help to increase the contact area between the pixel electrode layer 80 and the drain electrode 60, thereby enhancing electrical conductivity.

In the step S208, the second insulating layer 90 may be made of silicon nitride and/or silicon dioxide by chemical vapor deposition.

By mounting the planarization layer 50 on the first insulating layer 30 and then forming the source electrode and the drain electrode on the planarization layer 50 and the semiconductor layer 40, the array substrate provided by the preferred embodiment can achieve the connection between the source electrode, the drain electrode and the semiconductor layer 40 without the need of forming source and drain through holes; and by directly forming the pixel electrode layer 80 on the planarization layer 50 and the drain electrode 60, the array substrate can achieve electrical connection between the drain electrode 60 and the pixel electrode layer 80 without the need of forming through holes, and therefore has functional effects of preventing bubbles from forming near through holes, and increasing aperture ratio. The planarization layer 50 further increases distances between the source electrode 70, the drain electrode 60 and the gate electrode 20, which enhances antistatic ability.

In conclusion, although the present invention has been described with reference to the preferred embodiment thereof, it is apparent to those skilled in the art that a variety of modifications and changes may be made without departing from the scope of the present invention which is intended to be defined by the appended claims.

What is claimed is:

1. An array substrate, comprising:
   a glass substrate;
   a gate electrode mounted on the glass substrate;
   a first insulating layer deposited on the glass substrate and the gate electrode;
   a semiconductor layer mounted on the first insulating layer and positioned on a top of the gate electrode;
   a planarization layer mounted on the first insulating layer;
   a source electrode mounted on the planarization layer and the semiconductor layer;
   a drain electrode mounted on the planarization layer and the semiconductor layer;
   a pixel electrode layer mounted on the planarization layer and the drain electrode; and
   a second insulating layer mounted on the planarization layer, the semiconductor layer, the source electrode and the drain electrode, wherein the drain electrode has a side surface which is away from one side of the source electrode and is inclined towards the source electrode, and the pixel electrode layer covers the side surface.

2. The array substrate as claimed in claim 1, wherein the semiconductor layer includes:
   an amorphous silicon layer deposited on the first insulating layer; and
   a doped semiconductor layer mounted on the amorphous silicon layer.

3. The array substrate as claimed in claim 1, wherein the first insulating layer is made of silicon nitride and/or silicon dioxide.

4. The array substrate as claimed in claim 1, wherein the second insulating layer is made of silicon nitride and/or silicon dioxide.

5. The array substrate as claimed in claim 1, wherein the planarization layer is formed by 3D printing using nano-powder material or liquid insulating material.

6. An array substrate, comprising:
   a glass substrate;
   a gate electrode mounted on the glass substrate;
   a first insulating layer deposited on the glass substrate and the gate electrode;
   a semiconductor layer mounted on the first insulating layer and positioned on a top of the gate electrode;
   a planarization layer mounted on the first insulating layer;
   a source electrode mounted on the planarization layer and the semiconductor layer;
   a drain electrode mounted on the planarization layer and the semiconductor layer;
   a pixel electrode layer mounted on the planarization layer and the drain electrode;
   a second insulating layer mounted on the planarization layer, the semiconductor layer, the source electrode and the drain electrode; wherein the semiconductor layer includes:

an amorphous silicon layer deposited on the first insulating layer; and a doped semiconductor layer mounted on the amorphous silicon layer;

the drain electrode has a side surface which is away from one side of the source electrode and is inclined towards the source electrode, and the pixel electrode layer covers the side surface.

7. A manufacturing method of an array substrate, comprising steps of:

mounting a gate electrode on a glass substrate;

depositing a first insulating layer on the glass substrate and the gate electrode;

depositing a semiconductor layer on the first insulating layer, wherein the semiconductor layer is disposed on a top of the gate electrode;

mounting a pianarization layer on the first insulating layer;

mounting a source electrode on the planarization layer and the semiconductor layer;

mounting a drain electrode on the planarization layer and the semiconductor layer;

mounting a pixel electrode layer on the planarization layer and the drain electrode; and depositing a second insulating layer on the planarization layer, the semiconductor layer, the source electrode and the drain electrode, wherein the drain electrode has a side surface which is away from one side of the source electrode and is inclined towards the source electrode, and the pixel electrode layer covers the side surface.

8. The manufacturing method as claimed in claim 7, wherein the planarization layer is formed by 3D printing using nano-powder material or liquid insulating material.

9. The manufacturing method as claimed in claim 7, wherein the first insulating layer and the second insulating layer are both made of silicon nitride and/or silicon dioxide.

* * * * *